(12) United States Patent
Braithwaite

(10) Patent No.: US 7,157,967 B2
(45) Date of Patent: Jan. 2, 2007

(54) SYSTEM AND METHOD FOR CONTROL OF LOOP ALIGNMENT IN ADAPTIVE FEED FORWARD AMPLIFIERS

(75) Inventor: Richard Neil Braithwaite, Orange, CA (US)

(73) Assignee: Powerwave Technologies Inc., Santa Ana, CA (US)

( * ) Notice: Subject to any disclaimer, the term of this patent is extended or adjusted under 35 U.S.C. 154(b) by 181 days.

(21) Appl. No.: 11/018,216

(22) Filed: Dec. 21, 2004

(65) Prior Publication Data

US 2005/0200409 A1    Sep. 15, 2005

Related U.S. Application Data

(60) Provisional application No. 60/552,405, filed on Mar. 11, 2004.

(51) Int. Cl.
*H03F 1/00* (2006.01)
(52) U.S. Cl. ........................ 330/151; 330/149
(58) Field of Classification Search ............ 330/151, 330/149, 2; 375/297; 455/114.3
See application file for complete search history.

(56) References Cited

U.S. PATENT DOCUMENTS

| | | | |
|---|---|---|---|
| 4,517,521 A | 5/1985 | Preschutti et al. | |
| 5,444,418 A | 8/1995 | Mitzlaff | |
| 5,831,478 A | 11/1998 | Long | |
| 6,054,896 A | 4/2000 | Wright et al. | |
| 6,078,216 A | 6/2000 | Proctor, Jr. | |
| 6,172,565 B1 | 1/2001 | Chen et al. | |
| 6,414,546 B1 | 7/2002 | Cavers | |
| 6,515,544 B1 | 2/2003 | Suzuki et al. | |
| 6,734,732 B1 * | 5/2004 | Cavers | 330/149 |
| 6,956,430 B1 * | 10/2005 | De Poortere | 330/2 |
| 6,998,909 B1 * | 2/2006 | Mauer | 330/2 |
| 2001/0043118 A1 | 11/2001 | Suzuki et al. | |
| 2002/0008577 A1 | 1/2002 | Cova et al. | |
| 2003/0005009 A1 | 1/2003 | Usman | |
| 2003/0011427 A1 | 1/2003 | Cavers et al. | |
| 2003/0030487 A1 | 2/2003 | Johnson et al. | |

* cited by examiner

*Primary Examiner*—Henry Choe
(74) *Attorney, Agent, or Firm*—David L. Henty; Myers Dawes Andras & Sherman LLP

(57) ABSTRACT

A fast search algorithm for loop alignment of a feed forward amplifier is disclosed. The algorithm controls a processor that adjusts, digitally, the gain and phase of the loop alignment based on power measurements at the input and output of cancellation combiners, to find the optimal setting. A "non-collinear descent" algorithm is used to search, iteratively, for the minimum within an error surface. For loop alignment, the error surface is defined by the set of measurement points comprising the alignment settings and the associated cancellation residuals. For the case of first loop alignment, the cancellation residual is measured using the ratio of two power detectors located at the input and after the cancellation (error) combiner. For second loop alignment, cancellation is estimated using the residual pilot power detected at the output of the amplifier. The preferred alignment method uses three successive measurements to estimate the gradient direction with respect to gain and phase shifter settings. The actual descent direction is selected to be close to the gradient direction without being collinear with the most recent alignment adjustments. Quantization of the descent direction simplifies the implementation as well as the enforcement of the non-collinearity constraint on successive alignment settings. Two different step size selection approaches are disclosed, however, any standard step size selection approach may be employed.

34 Claims, 8 Drawing Sheets

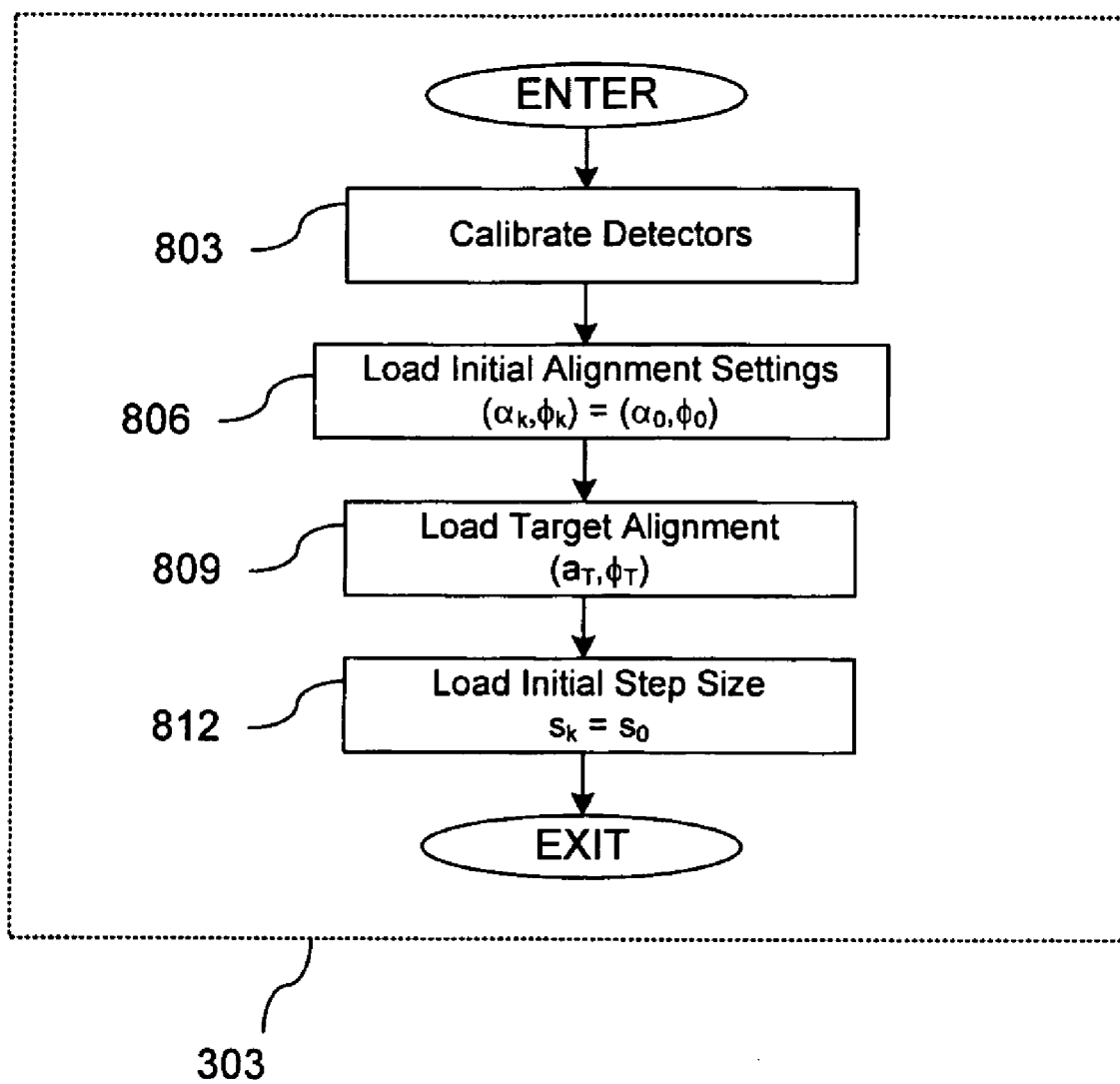

SYSTEM AND METHOD FOR CONTROL OF LOOP ALIGNMENT IN ADAPTIVE FEED FORWARD AMPLIFIERS

RELATED APPLICATION INFORMATION

The present application claims priority to provisional application Ser. No. 60/552,405 filed Mar. 11, 2004, the disclosure of which is incorporated by reference herein in its entirety.

FIELD OF THE INVENTION

The present invention relates to power amplifiers. In particular, it relates to adaptive feed forward power amplifiers and methods for controlling feed forward amplifiers.

BACKGROUND, PRIOR ART AND RELATED INFORMATION

RF amplifiers are devices that attempt to replicate an RF signal present at an input, producing an output signal with a much higher power level. The increase in power from the input to output is referred to as the 'gain' of the amplifier. When the gain is constant across the dynamic range of the input signal, the amplifier is said to be 'linear'. Amplifiers have limited capacity in terms of power delivered because of gain and phase variances, particularly saturation at high power, which makes all practical amplifiers nonlinear when the input power level varies. The ratio of the distortion power generated relative to the signal power delivered is a measure of the non-linearity of the amplifier.

In RF communication systems, the maximum allowable non-linearity of the amplifier is specified by government agencies such as the FCC or the ITU. Because amplifiers are inherently nonlinear when operating near saturation, the linearity requirements often become the limitation on rated power delivering capability. In general, when operating near saturation, the linearity of the amplifier degrades rapidly because the incremental signal power delivered by an amplifier is proportionally less than the incremental distortion power generated.

Various compensation approaches are conventionally applied to reduce the distortion at the output of the system, which in turn increases the rated power delivering capability. The preferred approach is feed forward compensation. In feed forward RF power amplifiers an error amplifier is employed to amplify main amplifier distortion components which are then combined out of phase with the main amplifier output to cancel the main amplifier distortion component. In general, feed forward compensation provides the power capability of the main amplifier and the linearity of the error amplifier.

Feed forward linearization of an amplifier is based on the matching of the gain and phase of parallel RF paths to either cancel the carrier (input) signal (loop 1) or to cancel the distortion (loop 2). The carrier cancellation is usually referred to as the 'loop 1 error', which is an estimate of the distortion of the main amplifier path. The distortion cancellation occurs within loop 2, and uses the loop 1 error to cancel the distortion of the main amplifier. The matching of the gain and phase in the respective loops is referred to as 'loop alignment control'. When the alignment of loop 2 is correct, the distortion at the output is minimized, making the entire feed forward system more linear than the main amplifier alone. When the alignment of loop 1 is correct, the power through the error amplifier (which amplifies the loop 1 error) is limited. In most cases, the loop 1 alignment must be completed before the error amplifier of loop 2 is enabled. This ensures that the error amplifier is not over-driven, a condition that could produce unwanted distortion or device damage.

There have been numerous prior approaches to feed forward linearization, the earliest dating to the 1920's. In earlier approaches, the alignment settings were static, with fixed settings for gain and phase, optimized for nominal operating conditions. Later adaptive methods were applied where the misalignments of the loops were measured internally and used for subsequent alignment adjustments. Adaptive feed forward control systems can provide for compensation of dynamically changing parameters, such as temperature and DC supply variations, which affect amplifier performance. Generally, it is desirable to have the feed forward amplifier control system adapt to the optimal settings as fast as possible to minimize the amount of time the amplifier operates at a less than optimal setting.

Adaptive feed forward control methods employ alignment control algorithms to adjust the alignment settings (gain and phase) from any initial setting to that which results in the best measured alignment. Prior alignment control algorithms rely on either the "steepest descent" or the "coordinate descent" algorithms. The steepest descent algorithm adjusts the alignment settings in a direction of the gradient within the 2D gain-phase space. Dithering the alignment in orthogonal directions and measuring the changes in measured misalignment provides an estimate of the gradient. The coordinate descent algorithm performs two separate 1D searches along pre-defined orthogonal directions (usually the gain and phase axes). The alignments are dithered to determine which direction along the respective coordinates reduces measured misalignment. Both these approaches have disadvantages in practical systems which employ control processors with limited processing power and where fast loop alignment is desired. As a result the desired fast and accurate loop convergence has not been achieved in practical adaptive feed forward systems.

Accordingly, a need presently exists for a system and method for rapid loop alignment control in a feed forward amplifier system which avoids the above noted limitations of the prior art.

SUMMARY OF THE INVENTION

In a first aspect the present invention provides a method for rapid alignment of a control loop of an amplifier system. The method comprises obtaining a plurality of prior alignment settings, each defining a point in a space of alignment settings, including at least three prior settings which are non-collinear in the space of alignment settings. The method further comprises determining an adjustment direction using the non-collinear prior adjustment settings and adjusting one or more of the control loop settings using the adjustment direction.

In a preferred embodiment of the method for rapid alignment of a control loop of an amplifier system the space of alignment settings comprises a three dimensional space defined by possible gain adjustment settings, phase adjustment settings and detected alignment error values. Adjusting one or more of the control loop settings preferably comprises adjusting the gain setting or adjusting the phase setting. The amplifier system may be a feed forward amplifier comprising a carrier cancellation control loop and an error cancellation control loop. Adjusting one or more of the control loop settings may comprise adjusting the gain setting or adjusting the phase setting of the carrier cancellation control loop. The carrier cancellation control loop may also comprise an input test coupler and a carrier cancellation test coupler and the detected alignment error values may comprise the ratio of detected carrier power between the carrier cancellation test coupler and the input test coupler. Adjusting one or more of the control loop settings may also comprise adjusting the gain setting or adjusting the phase setting of the error cancellation control loop. The error cancellation control loop may comprise an error cancellation test coupler and the detected alignment error values may comprise detected error signal power at the test coupler. The feed forward amplifier may further comprise a source of a pilot signal and the detected alignment error values may comprise detected residual pilot signal power. The adjustment direction may take discrete values in the space of alignment settings.

According to another aspect the present invention provides a method for controlling an amplifier system having a control loop comprising a control loop input, a first signal path, a second signal path, a control loop output, and a control loop error test coupler, at least one of the first and second signal paths including an amplifier. The method comprises detecting a control loop error value using a signal sampled by the control loop error test coupler and determining a point in a space of loop control settings using the detected error value and two or more loop control parameters. The method further comprises determining a plane in the space of loop control settings and determining a gradient in the space of loop control settings. The method further comprises selecting an adjustment direction in the space of loop control settings using the plane and gradient information and adjusting one or more of the loop control parameters using the adjustment direction.

In a preferred embodiment the method for controlling an amplifier system further comprises sampling the signal at the control loop input and detecting a control loop error value comprises determining the ratio of the signal sampled by the control loop error test coupler and the signal sampled at the control loop input. The control loop may further comprise a gain adjuster and a phase adjuster and the two or more loop control parameters may comprise gain and phase adjuster settings. The space of loop control settings may comprise a three dimensional space defined by possible gain adjuster settings, phase adjuster settings and loop error values. Determining a plane in the space of loop control settings preferably comprises obtaining a plurality of successive prior settings each defining a point in the space of loop control settings, determining if at least three non-collinear prior setting points are available, and if they are, determining a plane in the space of loop control settings using the at least three non-collinear prior setting points. Determining a plane in the space of loop control settings preferably further comprises determining the normal vector to the plane from the at least three non-collinear prior setting points. The method may further comprise determining the slope of the plane and determining if the slope has a zero value, wherein the gradient direction is determined only if the slope has a nonzero value. Selecting an adjustment direction in the space of loop control settings preferably comprises selecting a direction close to the gradient direction without being collinear with the last two prior setting points. For example, selecting an adjustment direction in the space of loop control settings may comprise comparing plural discrete directions to the gradient direction and selecting the closest non-collinear direction. Adjusting one or more of the loop control parameters using the adjustment direction may further comprise using a step size for adjusting the one or more loop control parameters and altering the step size by comparing the step size to bounding step size values. Alternatively, the step size may be altered based on the detected control loop error value.

According to another aspect the present invention provides a feed forward amplifier system comprising an input for receiving an RF input signal and a first control loop coupled to the input. The first control loop comprises a main amplifier, a main amplifier sampling coupler, a delay element, and a cancellation combiner. A second control loop is coupled to the first control loop and comprises a first signal path, a second signal path comprising an error amplifier, and an error coupler coupling the first and second signal paths. An output is coupled to the error coupler. The feed forward amplifier system further comprises a control system, coupled to and controlling at least one of the first and second control loops employing adjustable loop control settings. The control system comprises a processor programmed with a non-collinear descent algorithm which selects a control setting adjustment direction which is non-collinear with plural recent prior settings.

In a preferred embodiment of the feed forward amplifier system the first control loop further comprises a gain adjuster and a phase adjuster. The control system is coupled to the gain adjuster and phase adjuster and the adjustable loop control settings comprise a loop 1 gain adjuster setting and a loop 1 phase adjuster setting. The second control loop may also include a gain adjuster and a phase adjuster. The control system is coupled to the loop 2 gain adjuster and phase adjuster, and the adjustable loop control settings comprise a loop 2 gain adjuster setting and a loop 2 phase adjuster setting. The first control loop further may comprise an input test coupler, coupled to sample the input signal, which provides a sampled input signal to the processor and a loop 1 test coupler coupled to sample the output of the carrier cancellation combiner which provides a sampled loop 1 test signal to the processor. The algorithm preferably employs the ratio of the sampled loop 1 test signal and sampled input signal to adjust the gain and phase settings. The feed forward amplifier may further comprise a source of a pilot signal and the second control loop may further comprise a loop 2 test coupler for sampling the loop 2 output. The feed forward amplifier may further comprise a pilot signal detector, coupled to the loop 2 test coupler and providing a detected residual pilot power signal to the processor, and the algorithm may employ the detected residual pilot power signal to adjust the gain and phase settings. The non-collinear descent algorithm preferably uses at least three successive prior settings to estimate a gradient direction for adjusting the control settings. The non-collinear descent algorithm preferably selects the adjustment direction to be close to the gradient direction without being collinear with the most recent alignment adjustment settings. For example, the non-collinear descent algorithm may select the adjustment direction by comparing quantized descent directions to the gradient direction.

According to another aspect the present invention provides an adaptive controller for aligning a control loop of an amplifier system. The adaptive controller comprises one or more inputs for receiving one or more test signals corresponding to alignment error of the amplifier system control loop. The adaptive controller further comprises a processor coupled to the one or more inputs and having one or more control outputs. The processor is programmed with an algorithm to provide loop adjustment settings to the control outputs to control the loop of the amplifier system. The algorithm retrieves plural recent prior settings and selects a control setting adjustment direction which is non-collinear with the plural recent prior settings.

In a preferred embodiment of the adaptive controller for aligning a control loop of an amplifier system the algorithm retrieves at least three successive most recent prior settings. The algorithm preferably determines a plane and a gradient direction in a space of settings and determines the non-collinear adjustment direction using the plane and the gradient direction. The space of settings may comprise a three dimensional space defined by possible gain adjustment settings, phase adjustment settings and alignment error values. The one or more inputs for receiving test signals may receive a sampled output signal including a pilot signal. The adaptive controller may include a pilot signal detector, coupled to the test signal input and providing a detected residual pilot power signal to the processor, and the algorithm employs the detected residual pilot power signal to control the loop of the amplifier system.

Further features and advantages of the present invention are set out in the following detailed description.

BRIEF DESCRIPTION OF THE DRAWINGS

FIG. 8 is a flow diagram of the process flow for initialization of a loop alignment search, in accordance with a preferred embodiment of the present invention.

DETAILED DESCRIPTION OF THE INVENTION

Figure 1:
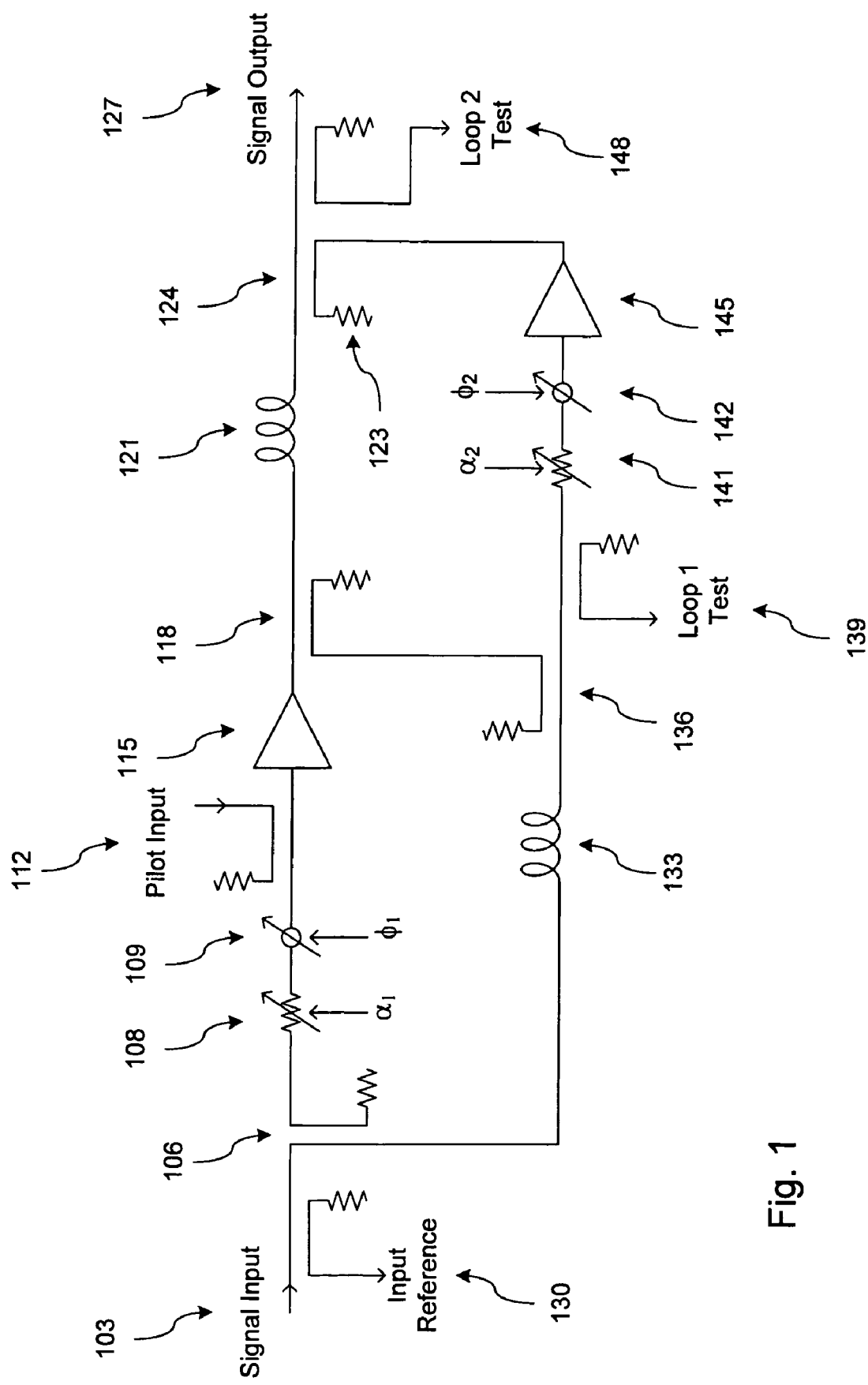
FIG. 1 is a block schematic diagram of a feed forward power amplifier in accordance with a preferred embodiment of the present invention.
Figure 2:
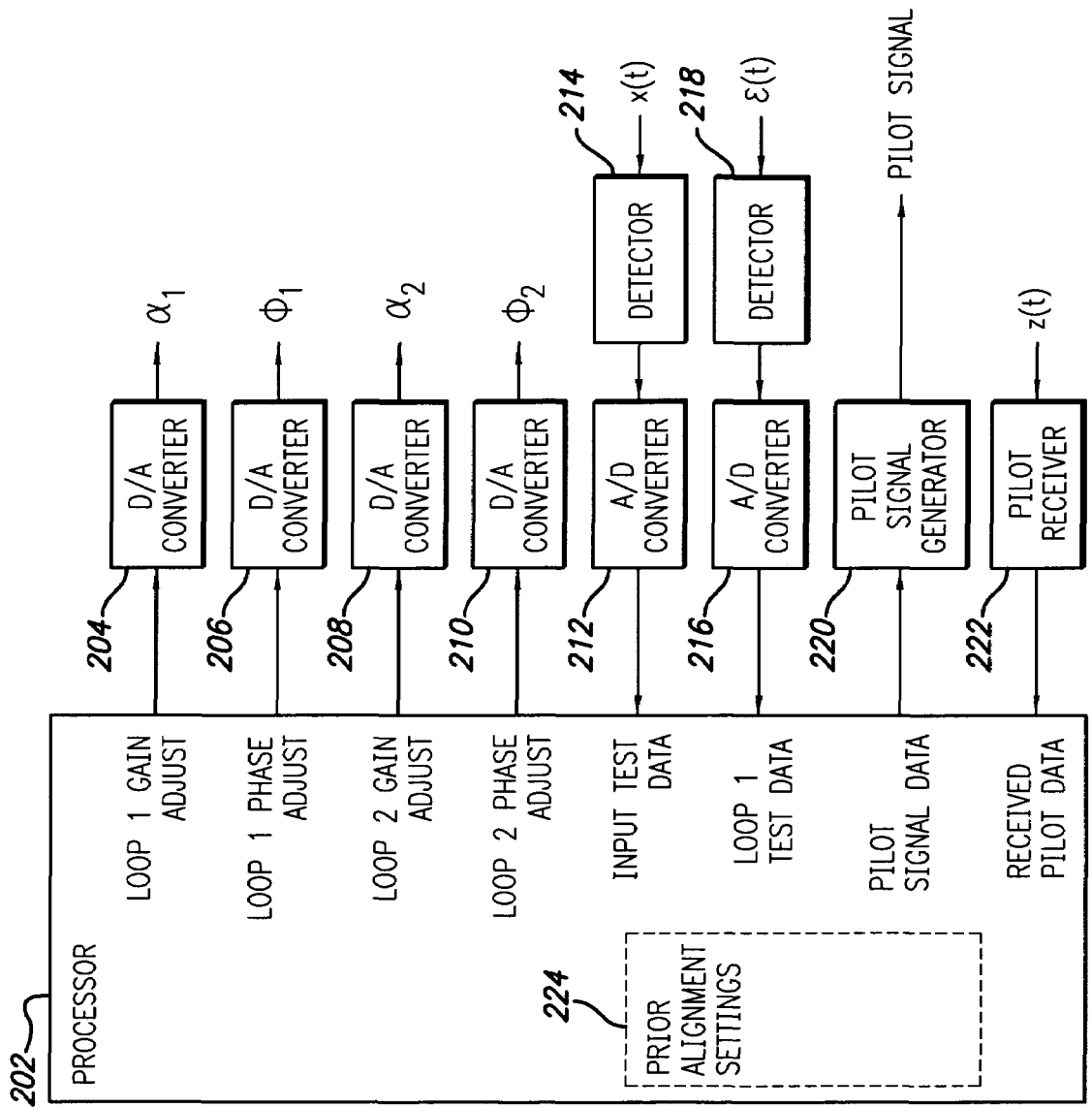
FIG. 2 is a block schematic drawing of a loop control system in accordance with a preferred embodiment of the present invention.

The block diagram of a feed forward compensated power amplifier (PA) in accordance with a preferred embodiment of the present invention is shown in FIGS. 1 and 2. FIG. 1 illustrates the basic feed forward amplifier and FIG. 2 illustrates the control system.

As shown in FIG. 1, the feed forward amplifier has a conventional architecture employing two control loops. Loop 1 comprises signal input 103, sampling coupler 106, gain adjuster 108, phase adjuster 109, pilot signal input coupler 112, main amplifier 115, main sampling coupler 118, input test coupler 130, delay 133, cancellation combiner 136, and loop 1 (or carrier cancellation) test coupler 139. Loop 2 comprises main sampling coupler 118, main path delay 121, error coupler 124, carrier cancellation combiner 136, loop 2 gain adjuster 141, loop 2 phase adjuster 142, error amplifier 145, loop 2 (or error cancellation) test coupler 148 and output 127.

As shown in FIG. 2, the control system may comprise a processor 202 which is programmed to implement loop control processing employing an adaptive controller algorithm described in detail below. The loop 1 alignment involves the adjustment of the gain and phase shifter control settings, denoted by $\alpha_1$ and $\phi_1$, to minimize the power detected at 'loop 1 test', within FIG. 1. The processor may also (optionally) receive input test data corresponding to detected input power and operate to minimize the ratio of the power detected at loop 1 test to detected input power. The loop 2 alignment involves the adjustment of the gain and phase shifter control settings, denoted by $\alpha_2$ and $\phi_2$, to minimize the power detected at 'loop 2 test' within FIG. 1. This power may (optionally) correspond to a residual (uncancelled) pilot signal.

More specifically, as shown in FIG. 2, processor 202 receives input test data x(t) from (optional) input test coupler 130 via power detector 214 and A/D converter 212 and loop 1 test data $\epsilon$(t) from loop 1 test coupler 139 via power detector 218 and A/D converter 216. An (optional) pilot generator 220 generates a pilot signal which is provided to pilot signal input coupler 112 (shown in FIG. 1). A pilot signal receiver 222 detects any uncancelled pilot signal z(t) from the loop 2 test coupler 148 (shown in FIG. 1) and provides the detected pilot signal in digital form to processor 202. The processor 202 generates a sequence of alignment settings to reduce the cancellation residual (defined below). Digital to analog converters 204, 206, 208, 210 convert the loop 1 and loop 2 digital gain adjust and phase adjust control signals to analog signals $\alpha_1, \phi_1, \alpha_2, \phi_2$ which are provided to the gain and phase adjusters 108, 109, 141 and 142 (shown in FIG. 1). Adjuster settings along with associated loop error values are stored in a suitable memory 224 associated with processor 202 to allow plural successive settings to be used by the loop control algorithm as discussed below.

The algorithm for the first loop alignment control preferably minimizes the normalized error power at the first test loop. The normalization can have various forms depending on the type of detectors used to measure the input and error powers. If RMS (Root Mean Square) detectors are used, and the input and error measurements are averaged over time, the normalized squared error is $$P_k = \frac{L\{|\epsilon|^2\}}{L\{|x|^2\}} \quad \text{(Eq. 1)}$$

where L{ } indicates a linear operator such as averaging or filtering; the subscript k indicates time. If logarithmic detectors are used, and the input and power measurements are averaged over time, the normalized squared error is $$10 \log_{10}\{P_k\} = L\{|\epsilon|^2\} - L\{|x|^2\}. \quad \text{(Eq. 2)}$$

The former normalization is the ratio of arithmetic means. The latter normalization, after conversion from log-to-linear, is the ratio of geometric means. The below described algorithm can be applied to either type of error function.

The measured normalized squared error is a function of the alignment settings at time k:

$$P_k = P(\alpha_k, \phi_k). \quad \text{(Eq. 3)}$$

The set of possible alignment settings forms an error surface. The task of the alignment control algorithm is to adjust the alignment from any initial setting to that which results in the minimum normalized squared error.

In the above, it is assumed that the detected error is used for the alignment of the first loop. The second loop alignment is similar to the first loop, except that a pilot signal is preferably used. The pilot signal is injected into coupler 112 (shown in FIG. 1). For the case when the pilot signal is a tone of fixed amplitude, the normalized power described in (Eq. 1) is not required. The residual pilot detected at the output coupler 148 is used directly as the estimate of the cancellation residual. Filtering is preferably used to separate the pilot from the carrier (input) signal. Various pilot generation and detection circuits may be employed. For example, pilot generation and detection circuits are disclosed in U.S. patent application Ser. No. 10/761,788 filed Jan. 21, 2004 and in U.S. patent application Ser. No. 10/838,985 filed May 5, 2004, which claims the benefit of provisional application Ser. No. 60/468,444 filed May 7, 2003, the disclosures of which are incorporated herein by reference in their entirety. The application of the technique described below may therefore be used for the alignment of the first loop or second loop, or both loops, using the appropriate detected error power as will be apparent to those skilled in the art. In the following, the term "cancellation residual" will therefore refer to $P_k$ as defined above in (Eq. 1) for loop 1 control or detected pilot power for loop 2 control. Other forms of detected loop alignment error may also be used, however, depending on the specifics of the control loop and the amplifier system.

Before describing the algorithm of the present invention details of prior search algorithms will first be described to introduce common background terminology and search algorithm concepts. As noted above, prior search methods rely on either the "steepest descent" or the "coordinate descent" algorithms. The steepest descent algorithm adjusts the alignment settings in a direction of the gradient within the 2D gain-phase space. Dithering the alignment in orthogonal directions and measuring the changes in $P_k$ provides an estimate of the gradient. The coordinate descent algorithm performs two separate 1D searches along pre-defined orthogonal directions (usually the gain and phase axes). The alignments are dithered to determine which direction along the respective coordinates reduces $P_k$.

The steepest descent algorithm is well known in the field of applied-mathematics and its convergence properties have been studied thoroughly. In the direct application of the steepest descent algorithm to loop alignment, the algorithm generates a sequence of alignment settings, $(\alpha_k, \phi_k)$, which produce, ideally, successively smaller values of the normalized squared error. Using directional derivatives, the sequence is defined recursively as $$(\alpha_{k+1}, \phi_{k+1}) = (\alpha_k, \phi_k) + (\Delta\alpha_k, \Delta\phi_k) \qquad (Eq.\ 4)$$

where $$(\Delta\alpha_k, \Delta\phi_k) = \left(-\beta_k \frac{\partial P_k}{\partial \alpha_k}, -\beta_k \frac{\partial P_k}{\partial \phi_k}\right) \qquad (Eq.\ 5)$$

and $\beta_k$ is a positive scalar term referred to as a "discount factor". The sequence is considered converged when $$\frac{\partial P_k}{\partial \alpha_k} = \frac{\partial P_k}{\partial \phi_k} = 0. \qquad (Eq.\ 6)$$

An alternative definition of the alignment update, (Eq. 5), uses a step size and a gradient direction, denoted by $s_k$ and $\theta_{grad}$, respectively:

$$(\Delta\alpha_k, \Delta\phi_k) = (-s_k \cos\theta_{grad}, -s_k \sin\theta_{grad}) \qquad (Eq.\ 7)$$

where $$\cos\theta_{grad} = \frac{\partial P_k}{\partial \alpha_k} \cdot \left\{\left[\frac{\partial P_k}{\partial \alpha_k}\right]^2 + \left[\frac{\partial P_k}{\partial \alpha_k}\right]^2\right\}^{-0.5} \qquad (Eq.\ 8)$$

$$\sin\theta_{grad} = \frac{\partial P_k}{\partial \phi_k} \cdot \left\{\left[\frac{\partial P_k}{\partial \alpha_k}\right]^2 + \left[\frac{\partial P_k}{\partial \alpha_k}\right]^2\right\}^{-0.5}. \qquad (Eq.\ 9)$$

and $$s_k = \beta_k \cdot \left\{\left[\frac{\partial P_k}{\partial \alpha_k}\right]^2 + \left[\frac{\partial P_k}{\partial \phi_k}\right]^2\right\}^{0.5}. \qquad (Eq.\ 10)$$

It is apparent that even when $\beta_k$ is constant, the desired step size $s_k$ varies over time, as a function of the magnitude of the gradient.

The selection of the step size is an important practical problem for steepest descent algorithms. Underestimating $s_k$ allows the sequence to converge, but increases the number of iterations, and hence the time, to reach the minimum. Overestimating the step size causes the sequence to overshoot the minimum, resulting in a limit cycle about the minimum. Choosing $s_k$ (or $\beta_k$) to balance convergence speed and steady-state error is a perennial problem.

The gradient is often computed using two directional derivatives each following a coordinate axis. Because power detectors are used, the derivative information is not available from a single measurement. Each derivative is approximated by the difference of two measurements whose alignment is displaced in the specified direction. For example, the directional derivative associated with the phase is approximated as $$\frac{\partial P}{\partial \phi} \approx \frac{P(\alpha, \phi + \Delta\phi) - P(\alpha, \phi)}{\Delta\phi} \qquad (Eq.\ 11)$$

where $\Delta\phi$ is the phase derivative step size. The directional derivative for the amplitude is computed in a similar manner. The step sizes used for estimating the derivatives are not necessarily coupled to the step size used to improve the alignment (see (Eq. 7)). To distinguish between the two step sizes, the former will be referred to as the "derivative step size", while the latter will retain the term "step size."

The desired step size defined by (Eq. 10) is proportional to the magnitude of the gradient; the desired direction of the alignment adjustment is the gradient direction. For bowl-shaped error surfaces, the gradient decreases towards zero as the search converges towards the desired alignment setting. Because of difficulties associated with measuring the gradient, some known methods use other means of selecting the direction and decreasing the step size as the search converges.

The coordinate descent method restricts the direction of alignment adjustments to 0, $\pi/2$, $\pi$, or $3\pi/4$ radians. These directions correspond to an increase in the gain setting, an increase in the phase setting, a decrease in the gain setting, or a decrease in the phase setting, respectively.

One approach is to choose a fixed step size and move in a selected direction, making adjustments if needed. If the direction is chosen correctly (to within $\pi/2$ radians of the gradient direction), a small step will improve the alignment, as indicated by a decrease in $P_k$. A step size that is too large will increase $P_k$ despite proper direction selection because the minimum is grossly overshot. Thus, it is possible to use changes in $P_k$ to determine if the step size and direction are appropriate. If the iterative sequence experiences a slow monotonic decrease in $P_k$, the direction is correct, but the step size is too small. If $P_k$ increases despite large changes in the direction ($\pi$ radians), then the step size is too large.

In terms of a step size selection algorithm, the step size is reduced by a scalar multiple each time the direction is reversed by $\pi$ radians (referred to as a "sign change" in the step size) in search of lower $P_k$'S. The step size is increased by a scalar multiple if $P_k$ is decreasing after N steps in a given direction. This method of step size selection is referred to as the "sign reversal method".

The magnitude of the step can also be varied as a function of $P_k$, which decreases as the alignment search converges. The method is referred to as "direct power mapping" because it maps the step size to the normalized squared error $P_k$.

The three key problems with prior implementations of the steepest descent algorithm are the estimation of the gradient, the computation of square roots, and the selection of the step size.

It is apparent that more alignment adjustments are made to estimate the gradient than to minimize the normalized squared error, $P_k$. That is, there are conflicting requirements on the sequence of adjustments of the loop alignment settings. On one hand, alignment adjustments that reduce the normalized squared error are desired, as described by (Eq. 4); on the other hand, the search must deviate from the optimal path to obtain reliable estimates of the derivatives (see (Eq. 11)). The additional alignment changes slow the convergence speed.

When using a microprocessor to control the alignment, the available computational power may be small. Estimation of the gradient direction using (Eq. 8) and (Eq. 9) is made challenging for a microprocessor because of the square root and division operations.

The step size selection in (Eq. 10) is made difficult by uncertainties in the gradient estimate. As a result, the accuracy of the derivative estimates has significant impact on the stability of the search algorithm. The selection of the derivative step size becomes of critical importance because an insufficient step size can result in the derivative estimate being corrupted excessively by noise, PA distortion, and detector quantization. An excessive derivative step size can straddle the minimum, underestimating the gradient, thereby slowing the convergence. The coordinate descent method has similar shortcomings to the steepest descent. Instead of a gradient, the directional derivative must be computed.

With the inherent inaccuracies in the difference approximation of the derivatives, it is important to decouple the step size from the gradient estimation. Basing the step size selection on direct power mapping or sign reversals reduces effect of inaccuracies in the gradient estimation. The power mapping approach is well suited to the gradient method; however, the mapping must be obtained experimentally.

Combining the "power to step size" mapping and the coordinate descent is less effective because the ideal step size for each coordinate direction is different. Compared to the gradient direction step size, the ideal coordinate step size is less by a factor of $\cos(\theta_c - \theta_{grad})$, where $\theta_c$ is the coordinate direction. That is, the ideal step size can be zero (when $|\theta_c - \theta_{grad}| = \pi/2$) even though $P_k$ is larger than the minimum value. In general, the step size for one (or both) of the coordinate directions will be too large, leading to many incorrect steps, thereby slowing the convergence.

The sign reversal approach to step size selection performs equally well for both the steepest descent and coordinate descent methods. However, it requires more time to reach the minimum because it tends to enter a decaying limit cycle around the optimal alignment setting before settling to the desired value. That is, the search over-shoots the optimal setting and reverses the direction, repeatedly, before reaching the minimum.

The present invention provides an improved adaptive feed forward loop control search algorithm. The advantages of the approach of the present invention over prior art alignment systems include reduced convergence time, simplified implementation, and increased stability.

The algorithm of the present invention computes gradient directions using past alignment settings (referred to as "points" in a space of alignment settings which comprises a three dimensional space defined by possible gain adjustment settings, phase adjustment settings and detected loop alignment error values), thus eliminating the need for separate alignment adjustments for derivative estimation. As a result, the convergence speed is increased. The algorithm does not, in general, use the gradient as the descent direction. Instead, it chooses a "non-collinear" descent trajectory that allows the current gradient to be estimated reliably from past alignment settings. The non-collinear descent is chosen close to the gradient descent, on average (discussed later).

The implementation is preferably simplified for use on a microprocessor. The requirement for the gradient estimation is that the three points are non-collinear.

Enforcing non-collinear points is made easier by quantizing the permitted descent directions, thus forming a finite set. The descent direction selected from the set is the one closest to the gradient direction that is not collinear with the two most recent points. The selection of a descent direction from a finite set can be done without square root and division operations shown in (Eq. 8) and (Eq. 9).

To improve stability, the alignment step size is not a direct function of the gradient measurement. Two embodiments of the step size selection are disclosed. In the first embodiment, the step size is quantized for ease of microprocessor implementation. The current step size is compared to a range derived from the gradient estimate. The step size is raised or lowered to an adjacent quantized value, moving the step size towards the desired range. This gradual adjustment of the step size makes the iterative sequence less sensitive to errors in the derivative estimation. In the second embodiment, the step size is mapped to the cancellation residual. Since the non-collinear descent trajectory is close to the gradient descent, the uncertainty in the step size mapping is reduced compared to a coordinate descent implementation.

Figure 3:
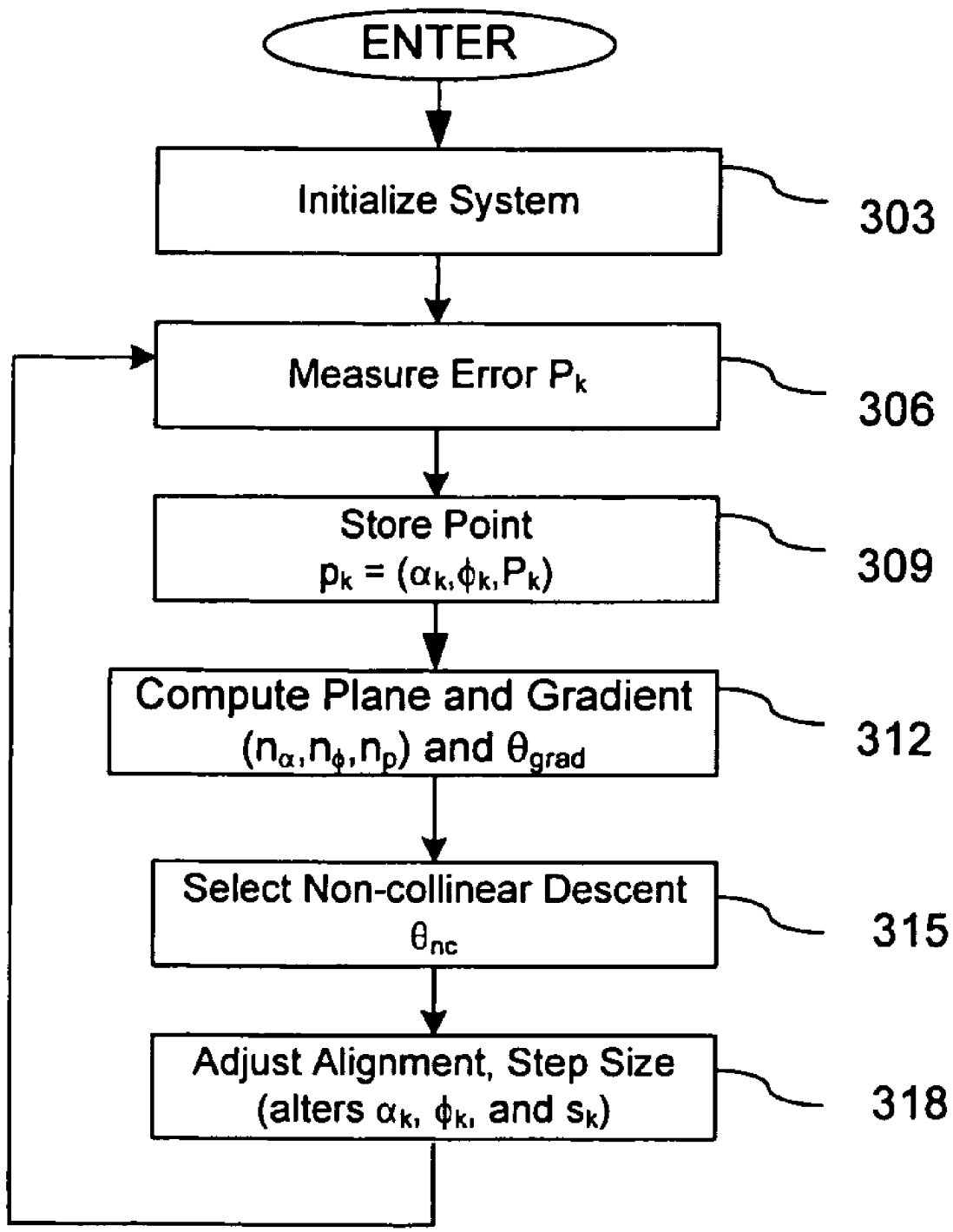
FIG. 3 is a flow diagram of a loop alignment control algorithm in accordance with a preferred embodiment of the present invention.

Next a specific implementation of the loop control search algorithm of the present invention will be described. A preferred embodiment of the basic process flow of the algorithm is shown in FIG. 3. The system is first initialized (303). (One preferred initialization process flow is shown in FIG. 8 described below.) The iterative process begins with a measurement (306) of the cancellation residual, $P_k$. A point, denoted by $p_k$, is created that is a triple comprising the gain and phase settings (denoted by $\alpha_k$ and $\phi_k$, respectively), as well as the cancellation residual, $P_k$:

$$p_k = (\alpha_k, \phi_k, P_k) \quad \text{(Eq. 12)}$$

The point is stored for later use (309). The planar approximation and the gradient direction are computed from the past points (312). The non-collinear descent direction is determined (315). The alignment and step size are adjusted (318). The iterative process continues with the next measurement of the cancellation residual (306).

The blocks associated with 303, 312, 315, and 318 are discussed below in greater detail.

Gradient Estimation

The gradient estimation approximates the local error surface as a plane. A vector normal to the surface, denoted by $n_{plane}$, defines the plane. It is the cross-product of two vectors formed using the three points:

$$n_{plane} = (n_\alpha, n_\phi, n_P) = (p_k - p_{k-1}) \times (p_k - p_{k-2}) \quad \text{(Eq. 13)}$$

where $p_k$, $p_{k-1}$, and $p_{k-2}$ are the three most recent points created as part of the iterative process. New planes are computed as the search process progresses, with the most recent plane being approximately tangent to the error surface at current point $p_k$.

For a given iteration, the planar approximation models the relationship between changes in the cancellation residual and adjustments in the alignment settings: that is, $$n_\alpha \Delta \alpha_k + n_\phi \Delta \phi_k = -n_P \Delta P_k \quad \text{(Eq. 14)}$$

where $(\Delta \alpha_k, \Delta \phi_k)$ is the change in the alignment setting and $\Delta P_k$ is the resulting change in the cancellation residual. The gradient direction is $$\cos \theta_{grad}(k) = \frac{n_\alpha}{\sqrt{n_\alpha^2 + n_\phi^2}} \quad \text{(Eq. 15)}$$

$$\sin \theta_{grad}(k) = \frac{n_\phi}{\sqrt{n_\alpha^2 + n_\phi^2}}. \quad \text{(Eq. 16)}$$

The preferred adjustment in the gain and phase shifters, without consideration of collinearity, is $$(\Delta \alpha_k, \Delta \phi_k)_{pref} = s_k \cdot \frac{(n_\alpha, n_\phi)}{\sqrt{n_\alpha^2 + n_\phi^2}} \quad \text{(Eq. 17)}$$

where $s_k$ is the step size.

It is apparent from (Eq. 17) that the gradient is undefined when $$(n_\alpha^2 + n_\phi^2) = 0 \quad \text{(Eq. 18)}$$

Since the three-point plane is a secant, rather than a tangent, it is possible to straddle the minimum without any of the three points reaching the optimal alignment setting. In the following, separate processing algorithms are used depending on whether (Eq. 18) is true or false.

Figure 4:
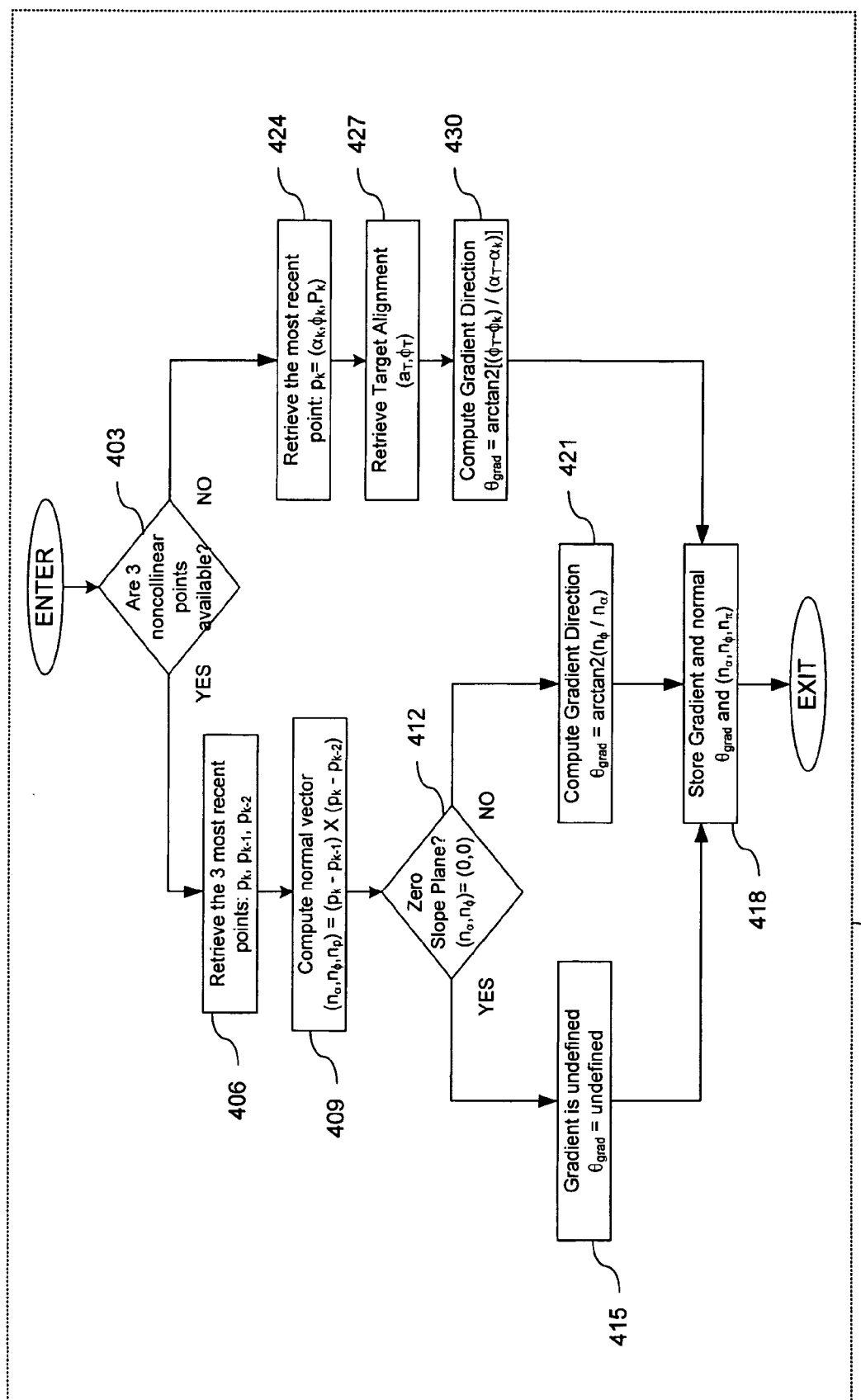
FIG. 4 is a flow diagram of a gradient estimation process flow in accordance with a preferred embodiment of the present invention.

The processing sequence for the gradient estimation is shown in FIG. 4. The past points are checked to determine if three non-collinear points are available (403). The disclosed algorithm guarantees that three successive points, if available, will be non-collinear (as described later). However, if the algorithm is modified to allow a collinear descent, it would be necessary to test additional (older) points to form the non-collinear triangle. The required test for non-collinearity is defined later in (Eq. 21).

If three non-collinear points are available, the points are retrieved (406) and the normal vector is computed (409). If the slope of the plane is zero, making (Eq. 18) true, the gradient is marked as undefined (415). If not, the gradient is computed (421). The gradient and the normal vector are stored for later subroutines (418).

If three non-collinear points are unavailable (for example, at start-up of the search progress), only the most recent point is retrieved (424). The target alignment, defined during the initialization stage (303), is retrieved (427). The target alignment, denoted by $(\alpha_T, \phi_T)$, is a best guess at the final alignment setting. It does not have to be accurate; it is designed to stabilize the algorithm during start-up. The gradient direction is computed (430) as the direction from the target alignment setting to the current alignment:

$$\cos \theta_{grad} = \frac{(\alpha_T - \alpha_k)}{\sqrt{(\alpha_T - \alpha_k)^2 + (\phi_T - \phi_k)^2}} \quad \text{(Eq. 19)}$$

$$\sin \theta_{grad} = \frac{(\phi_T - \phi_k)}{\sqrt{(\alpha_T - \alpha_k)^2 + (\phi_T - \phi_k)^2}}. \quad \text{(Eq. 20)}$$

The gradient is stored for later subroutines (418); the normal vector is set to $(n_\alpha, n_\phi, n_p) = (\cos \theta_{grad}, \sin \theta_{grad}, 0)$.

Non-Collinear Descent Direction

If the gradient is defined (that is, (Eq. 18) is false), the non-collinear descent direction is chosen as discussed below. When (Eq. 18) is true, an alternative approach to maintaining both convergence and a non-collinear descent is preferably used (see later, (Eq. 26)).

The descent direction must be non-collinear with the most recent alignment adjustment to ensure that the gradient estimate is reliable. The third element of the normal vector, $n_P$, will be zero if the three points are collinear. The test for non-collinearity is $$|n_P| > \gamma \cdot |d_P| \quad \text{(Eq. 21)}$$

where $\gamma > 0$ and $$d_p = (\alpha_2 - \alpha_1) \cdot (\alpha_3 - \alpha_1) + (\phi_2 - \phi_1) \cdot (\phi_3 - \phi_1). \quad \text{(Eq. 22)}$$

Note that $\arctan(n_P/d_P)$ is equal to one of the three angles within the triangle whose vertices are the three points. The recommended value for $\gamma$ is $\tan(\pi/4)$. The preferred approach restricts the descent direction to enforce (Eq. 21), while attempting to follow the gradient as close as possible.

To improve the computational efficiency, it is desirable to quantize the permitted descent directions to a small set. The alignment adjustment becomes $$(\Delta \alpha_k, \Delta \alpha_k) = (-s_k \cos \theta_{nc}(k), -s_k \sin \theta_{nc}(k)) \quad \text{(Eq. 23)}$$

where $$\theta_{nc}(k) = m_k \cdot \Delta \theta \quad \text{(Eq. 24)}$$

and $m_k$ is an integer. If, for example, eight descent directions are permitted, then $\Delta \theta = \pi/4$ radians.

Figure 5:
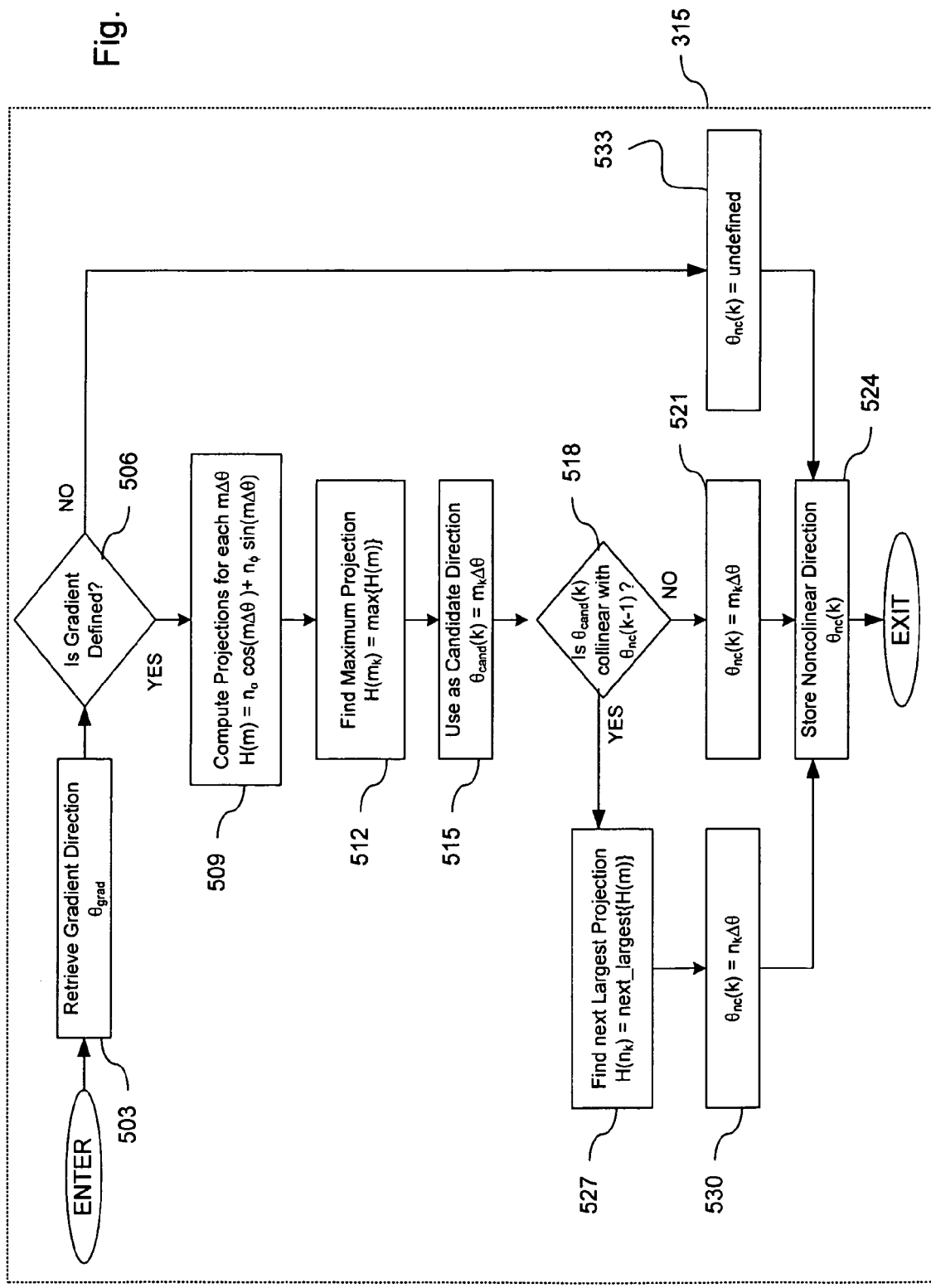
FIG. 5 is a flow diagram of a process flow for selection of a non-collinear descent direction in accordance with a preferred embodiment of the present invention.

The selection of the non-collinear descent direction, $\theta_{nc}$, is shown in FIG. 5. The gradient direction is retrieved (503) and checked to determine if it is defined (506). If the gradient is undefined (506), the non-collinear descent is also undefined (533). This is stored for later use (524).

If the gradient is defined, the vector $(n_\alpha, n_\phi)$ is projected onto to each of the permitted descent directions (509); the largest inner product is found (512) and selected as the candidate descent direction (515). If the candidate descent direction is not collinear with the past alignment adjustment (518), the candidate direction becomes the non-collinear descent (521). The non-collinear descent direction is stored for later use (524).

If the candidate descent direction is collinear with the past alignment adjustment (518), the second largest inner product is found (527). It becomes the non-collinear descent direction (530) and is stored for later use (524). Note that if the last step was in a given direction, that direction and it's negative are disallowed in the current step. As a result, the angle defined by $|\arctan(n_P/d_P)|$ will be greater than $\pi/4$ radians and less than $3\pi/4$ radians.

Also note that since the gradient vector does not have to be normalized by $[n_\alpha^2 + n_\phi^2]^{0.5}$ in order to select the non-collinear descent direction, the computational burden on the microprocessor is reduced.

Alignment and Step Size Update

The update of the alignment setting is as follows:

$$(\alpha_{k+1}, \phi_{k+1}) = (\alpha_k, \phi_k) + \beta_k \cdot (\Delta\alpha_k, \Delta\phi_k) \quad \text{(Eq. 25)}$$

where $(\Delta\alpha_k, \Delta\phi_k)$ is the alignment adjustment for the iteration k and $\beta_k$ is a discount factor ($0 < \beta_k <= 1$).

In the following, two embodiments of the alignment and step size update are discussed.

First Embodiment

Figure 6:
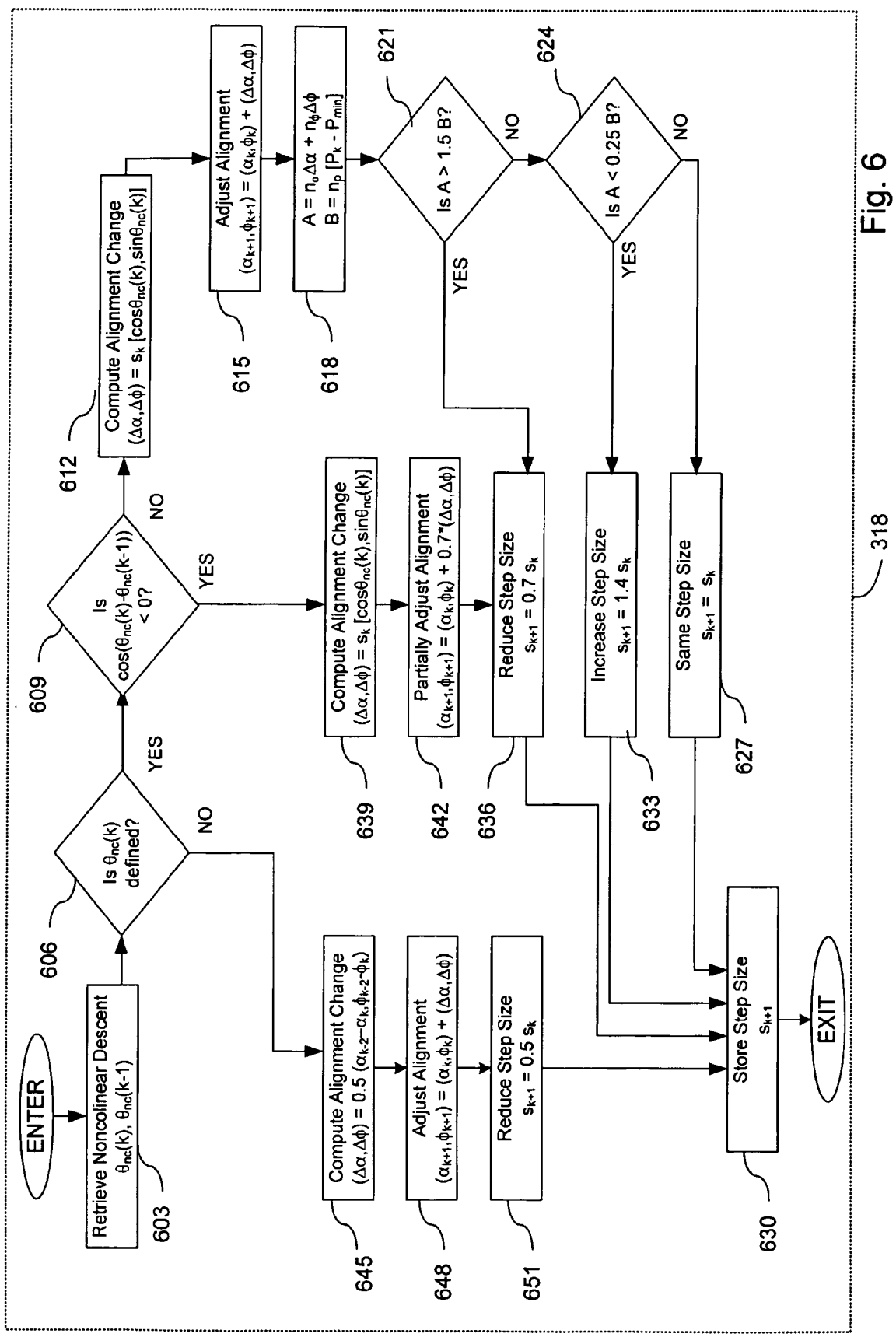
FIG. 6 is a flow diagram of a first embodiment of alignment and step size update process flow in accordance with the present invention.

The first embodiment of the alignment and step size update processing is shown in FIG. 6. Within the first embodiment, there are three ways to compute the alignment adjustment. To select the correct method, the processing tests if the descent direction is undefined and if the descent direction has reversed from its most recent value. The two most recent non-collinear descent directions are retrieved (603). If the most recent non-collinear descent $\theta_{nc}(k)$ is undefined, the alignment adjustment (645) is computed as follows:

$$(\Delta\alpha_k, \Delta\phi_k) = \frac{(\alpha_{k-2}, \phi_{k-2}) - (\alpha_k, \phi_k)}{2}. \quad \text{(Eq. 26)}$$

The alignment is updated (648) using (Eq. 25), with the discount factor set to unity ($\beta_k = 1$). Using (Eq. 26) reduces the size of the triangle defined by the three points while ensuring that the next three points are non-collinear. As a result, the iterative sequence will not stall before reaching the minimum. For the next iteration, the step size is reduced (651):

$$s_{k+1} = \frac{s_k}{2}. \quad \text{(Eq. 27)}$$

The new step size is stored for use in the next iteration (630).

If the most recent non-collinear descent $\theta_{nc}(k)$ is defined (606), a second test is applied to determine if the descent direction has reversed (609). A direction reversal occurs when previous alignment adjustment overshot the optimal alignment setting. This condition is indicated as follows:

$$\cos[\theta_{nc}(k) - \theta_{nc}(k-1)] < 0 \quad \text{(Eq. 28)}$$

where $\theta_{nc}(k-1)$ is the previous descent direction. If (Eq. 28) is true (609), the alignment adjustment is computed (639) using (Eq. 23). The alignment is updated (642) using (Eq. 25), with the discount factor set to 0.7 ($\beta_k = 0.7$). For the next iteration, the step size is reduced (636):

$$s_{k+1} = \frac{s_k}{\sqrt{2}}. \quad \text{(Eq. 29)}$$

The new step size is stored for use in the next iteration (630). If the descent direction is defined (606) and (Eq. 28) is false (609), the alignment adjustment (612) proceeds using (Eq. 23). The alignment is updated (615) using (Eq. 25), with the discount factor set to unity ($\beta_k = 1$). The step size adjustment is described below.

The step size for the next iteration is computed from the planar approximation in (Eq. 14). Since $\Delta P$ ideally reduces the current $P_k$ to the minimum value, the result is $$n_\alpha \Delta\alpha_k + n_\phi \Delta\phi_k \approx n_p \lfloor P_k - P_{k,min} \rfloor \quad \text{(Eq. 30)}$$

where $P_{k,min}$ is the target minimum for the normalized squared error. Using (Eq. 17) and (Eq. 30), the approximate step size is $$s_k = \frac{n_P \lfloor P_k - P_{k,min} \rfloor}{\sqrt{n_\alpha^2 + n_\phi^2}}. \quad \text{(Eq. 31)}$$

Unfortunately, the step size in (Eq. 31) is not stable when the slope of the plane $(n_\alpha^2 + n_\phi^2)$ is small. In addition, the minimum value, $P_{k,min}$, is not known exactly (although it can be estimated as the iterations progress).

To limit the effect of uncertainties regarding the target minimum and the error surface shape, the step size selection is preferably decoupled from the current planar estimate. This is achieved by limiting the change in the step size between iterations. The step size is increased or decreased when the previous adjustment $(\Delta\alpha_k, \Delta\phi_k)$ is outside an allowable range. The range parameters are computed (618) as follows:

$$A = n_\alpha \Delta\alpha_k + n_\phi \Delta\phi_k \quad \text{(Eq. 32)}$$

$$B = n_p \lfloor P_k - P_{k,min} \rfloor. \quad \text{(Eq. 33)}$$

If $A > 1.5 B$, the current step size exceeds the higher bound (621). The step size is reduced (636):

$$s_{k+1} = \frac{s_k}{\sqrt{2}}. \quad \text{(Eq. 34)}$$

If $A < 0.25 B$, the current step size is below the lower bound (624). The step size is increased (633):

$$s_{k+1} = \sqrt{2} \cdot s_k \quad \text{(Eq. 35)}$$

If neither boundary test (621 or 624) is active, the step size remains the same (627). The new step size is stored for the next iteration (630).

If it is determined that the most recent non-collinear direction, $\theta_{nc}(k)$, is defined, but the previous descent direction, $\theta_{nc}(k-1)$, is not, the processing proceeds as if test 609 was false.

In the first embodiment of the alignment and step size update, the step size is quantized. As a result, the step size updates do not have to be computed. The index of the look-up table can be incremented or decremented as needed.

Note that the high and low bound (A>1.5B and A<0.25B) are suitable for RMS detectors or log detector outputs converted to RMS voltages. The planar approximation in (Eq. 31) tends to under-estimate the optimal step size for bowl-shaped error surfaces associated with RMS detectors. In contrast, the planar approximation may over-estimate the step size for funnel-shaped error surfaces associated with log detectors (not converted to RMS). In the latter case, different high and low bounds would be required. It is preferred that the minimum and maximum values of the step size be specified and enforced.

Second Embodiment

Figure 7:
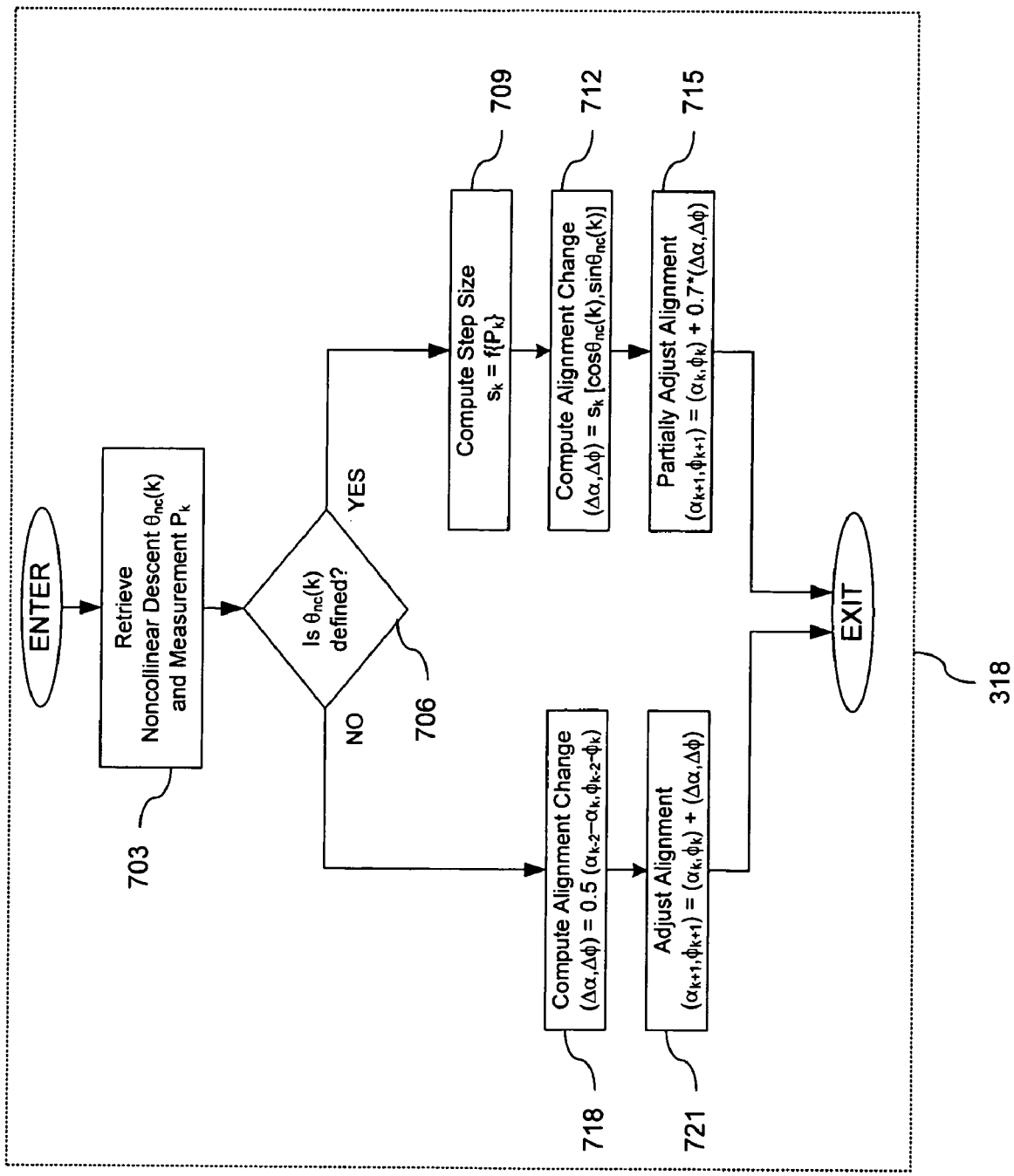
FIG. 7 is a flow diagram of a second embodiment of alignment and step size update process flow in accordance with the present invention.

A second embodiment of the alignment and step size update is shown in FIG. 7. The primary difference is that it selects the step size based on the cancellation residual: that is, $$s_k = f\{P_k\} \tag{Eq. 36}$$

where f{ } is a specified function.

In the second embodiment, the most recent values of the non-collinear descent direction and measurement $P_k$ are retrieved (703). The descent direction is tested (706). If it is undefined, the alignment adjustment (718) defined by (Eq. 26) is used. The alignment is updated (721) using (Eq. 25), with the discount factor set to unity ($\beta_k$=1).

If the descent direction is defined (706), the step size is computed (709) using the mapping in (Eq. 36). The alignment adjustment (712) is based on (Eq. 23). The alignment is updated (715) using (Eq. 25), with the discount factor set to 0.7 ($\beta_k$=0.7). Although the mapping in (Eq. 36) can be obtained from experiments, it can be seen that (Eq. 31) is a potential cancellation residual to step size mapping.

The residual mapping assumes that the descent direction is equal to the gradient direction, which is only true on average. For the non-collinear descent, the step size is in error by a factor of the $\cos(\theta_{nc}-\theta_{grad})$, where $\theta_{nc}$ is the non-collinear descent direction. The worst-case difference between the non-collinear descent and the gradient is $\pi/4$ radians for the 8-direction quantization. As a result, the maximum error in the step size is a factor of 1.4. This is easily handled by assigning the discount factor of $\beta_k$=0.7.

Initialization of Search

The initialization process flow is shown in FIG. 8. The detectors are calibrated (803), and the initial values of the alignment settings (806), the target alignment settings (809), and the step size (812) are loaded. The details of calibration and the target alignment are discussed below.

Preferably the error and input detectors are either matched or calibrated for the first loop alignment so that the ratio of the power measurements is an estimate of the cancellation residual. As an example it may be assumed that both the input and error power measurements are obtained using log-detectors. During the calibration, the main amplifier is turned off. Since there is no cancellation, the two power detectors should have the same value; any differences are removed using calibration terms. By repeating these measurements at a set of input power levels, it is possible to compute the dB per DAC LSB (Least Significant Bit) scale factor. It is assumed that the cancellation measurements are converted from dB into linear terms resulting in a bowl-shaped error surface.

When the alignment search is initiated, only one point, $p_k$, is available. As a result, the gradient direction cannot be computed using the three-point method. A target alignment setting (best guess of the location of the minimum) is selected to allow a gradient direction to be specified.

For the first embodiment of the step size update, it is necessary to specify an initial step size. The initial selection of the step size is based on the initial normalized squared error, not unlike the second embodiment of the step size update. The required accuracy of the initial step size for the first embodiment is modest because the step size will adjust to compensate.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A method for rapid alignment of a control loop of an amplifier system, comprising:
    obtaining a plurality of prior alignment settings, each defining a point in a space of alignment settings, including at least three prior settings which are non-collinear in the space of alignment settings;
    determining an adjustment direction using said non-collinear prior adjustment settings; and
    adjusting one or more of the control loop settings using said adjustment direction.

2. A method for rapid alignment of a control loop of an amplifier system as set out in claim 1, wherein said space of alignment settings comprises a three dimensional space defined by possible gain adjustment settings, phase adjustment settings and detected alignment error values.

3. A method for rapid alignment of a control loop of an amplifier system as set out in claim 2, wherein adjusting one or more of the control loop settings comprises adjusting the gain setting or adjusting the phase setting.

4. A method for rapid alignment of a control loop of an amplifier system as set out in claim 2, wherein said amplifier system is a feed forward amplifier comprising a carrier cancellation control loop and an error cancellation control loop and wherein adjusting one or more of the control loop settings comprises adjusting the gain setting or adjusting the phase setting of the carrier cancellation control loop.

5. A method for rapid alignment of a control loop of an amplifier system as set out in claim 4, wherein the carrier cancellation control loop comprises an input test coupler and a carrier cancellation test coupler and wherein the detected alignment error values comprise the ratio of detected carrier power between the carrier cancellation test coupler and the input test coupler.

6. A method for rapid alignment of a control loop of an amplifier system as set out in claim 2, wherein said amplifier system is a feed forward amplifier comprising a carrier cancellation control loop and an error cancellation control loop and wherein adjusting one or more of the control loop settings comprises adjusting the gain setting or adjusting the phase setting of the error cancellation control loop.

7. A method for rapid alignment of a control loop of an amplifier system as set out in claim 6, wherein the error cancellation control loop comprises an error cancellation test coupler and wherein the detected alignment error values comprise detected error signal power at the test coupler.

8. A method for rapid alignment of a control loop of an amplifier system as set out in claim 7, wherein the feed forward amplifier further comprises a source of a pilot signal and wherein the detected alignment error values comprise detected residual pilot signal power.

9. A method for rapid alignment of a control loop of an amplifier system as set out in claim 2, wherein said adjustment direction takes discrete values in the space of alignment settings.

10. A method for controlling an amplifier system having a control loop comprising a control loop input, a first signal path, a second signal path, a control loop output, and a control loop error test coupler, at least one of said first and second signal paths including an amplifier, said method comprising:
  detecting a control loop error value using a signal sampled by the control loop error test coupler;
  determining a point in a space of loop control settings using the detected error value and two or more loop control parameters;
  determining a plane in the space of loop control settings;
  determining a gradient in the space of loop control settings;
  selecting an adjustment direction in the space of loop control settings using the plane and gradient information; and
  adjusting one or more of the loop control parameters using the adjustment direction.

11. A method for controlling an amplifier system as set out in claim 10, further comprising sampling the signal at the control loop input and wherein said detecting a control loop error value comprises determining the ratio of the signal sampled by the control loop error test coupler and the signal sampled at the control loop input.

12. A method for controlling an amplifier system as set out in claim 10, wherein said control loop further comprises a gain adjuster and a phase adjuster and wherein said two or more loop control parameters comprise gain and phase adjuster settings.

13. A method for controlling an amplifier system as set out in claim 12, wherein said space of loop control settings comprises a three dimensional space defined by possible gain adjuster settings, phase adjuster settings and loop error values.

14. A method for controlling an amplifier system as set out in claim 10, wherein said determining a plane in the space of loop control settings comprises obtaining a plurality of successive prior settings each defining a point in the space of loop control settings, determining if at least three non-collinear prior setting points are available, and if they are, determining a plane in the space of loop control settings using the at least three non-collinear prior setting points.

15. A method for controlling an amplifier system as set out in claim 14, wherein said determining a plane in the space of loop control settings further comprises determining the normal vector to the plane from said at least three non-collinear prior setting points.

16. A method for controlling an amplifier system as set out in claim 15, further comprising determining the slope of the plane, determining if the slope has a zero value, and wherein the gradient direction is determined only if the slope has a nonzero value.

17. A method for controlling an amplifier system as set out in claim 10, wherein selecting an adjustment direction in the space of loop control settings comprises selecting a direction close to the gradient direction without being collinear with the last two prior setting points.

18. A method for controlling an amplifier system as set out in claim 17, wherein selecting an adjustment direction in the space of loop control settings comprises comparing plural discrete directions to the gradient direction and selecting the closest non-collinear direction.

19. A method for controlling an amplifier system as set out in claim 10, wherein adjusting one or more of the loop control parameters using the adjustment direction further comprises using a step size for adjusting the one or more loop control parameters and altering the step size by comparing the step size to bounding step size values.

20. A method for controlling an amplifier system as set out in claim 10, wherein adjusting one or more of the loop control parameters using the adjustment direction further comprises using a step size for adjusting the one or more loop control parameters and altering the step size based on the detected control loop error value.

21. A feed forward amplifier system, comprising:
  an input for receiving an RF input signal;
  a first control loop coupled to the input and comprising a main amplifier, a main amplifier sampling coupler, a delay element, and a cancellation combiner;
  a second control loop coupled to the first control loop and comprising a first signal path, a second signal path comprising an error amplifier, and an error coupler coupling the first and second signal paths;
  an output coupled to the error coupler; and
  a control system, coupled to and controlling at least one of the first and second control loops employing adjustable loop control settings, said control system comprising a processor programmed with a non-collinear descent algorithm which selects a control setting adjustment direction which is non-collinear with plural recent prior settings.

22. A feed forward amplifier system as set out in claim 21, wherein said first control loop further comprises a gain adjuster and a phase adjuster, wherein said control system is coupled to said gain adjuster and phase adjuster, and wherein said adjustable loop control settings comprise a loop 1 gain adjuster setting and a loop 1 phase adjuster setting.

23. A feed forward amplifier system as set out in claim 21, wherein said second control loop further comprises a gain adjuster and a phase adjuster, wherein said control system is coupled to said gain adjuster and phase adjuster, and wherein said adjustable loop control settings comprise a loop 2 gain adjuster setting and a loop 2 phase adjuster setting.

24. A feed forward amplifier system as set out in claim 22, wherein said first control loop further comprises an input test coupler coupled to sample the input signal and providing a sampled input signal to the processor and a loop 1 test coupler coupled to sample the output of the carrier cancellation combiner and providing a sampled loop 1 test signal to the processor and wherein said algorithm employs the ratio of the sampled loop 1 test signal and sampled input signal to adjust said gain and phase settings.

25. A feed forward amplifier system as set out in claim 23, wherein the feed forward amplifier further comprises a source of a pilot signal and wherein said second control loop further comprises a loop 2 test coupler for sampling the loop 2 output.

26. A feed forward amplifier system as set out in claim 25, wherein the feed forward amplifier further comprises a pilot signal detector, coupled to the loop 2 test coupler and providing a detected residual pilot power signal to the processor, and wherein said algorithm employs the detected residual pilot power signal to adjust said gain and phase settings.

27. A feed forward amplifier system as set out in claim 21, wherein the non-collinear descent algorithm uses at least three successive prior settings to estimate a gradient direction for adjusting the control settings.

28. A feed forward amplifier system as set out in claim 27, wherein the non-collinear descent algorithm selects the adjustment direction to be close to the gradient direction without being collinear with the most recent alignment adjustment settings.

29. A feed forward amplifier system as set out in claim 28, wherein the non-collinear descent algorithm selects the adjustment direction by comparing quantized descent directions to the gradient direction.

30. An adaptive controller for aligning a control loop of an amplifier system, comprising:
one or more inputs for receiving one or more test signals corresponding to alignment error of the amplifier system control loop; and
a processor coupled to said one or more inputs and having one or more control outputs, wherein said processor is programmed with an algorithm to provide loop adjustment settings to said control outputs to control the loop of the amplifier system, wherein said algorithm retrieves plural recent prior settings and selects a control setting adjustment direction which is non-collinear with said plural recent prior settings.

31. An adaptive controller for aligning a control loop of an amplifier system as set out in claim 30, wherein said algorithm retrieves at least three successive most recent prior settings.

32. An adaptive controller for aligning a control loop of an amplifier system as set out in claim 30, wherein said algorithm determines a plane and a gradient direction in a space of settings and determines said non-collinear adjustment direction using said plane and said gradient direction.

33. An adaptive controller for aligning a control loop of an amplifier system as set out in claim 32, wherein said space of settings comprises a three dimensional space defined by possible gain adjustment settings, phase adjustment settings and alignment error values.

34. An adaptive controller for aligning a control loop of an amplifier system as set out in claim 32, wherein said one or more inputs for receiving test signals receives a sampled output signal including a pilot signal and wherein said adaptive controller further comprises a pilot signal detector, coupled to the test signal input and providing a detected residual pilot power signal to the processor, and wherein said algorithm employs the detected residual pilot power signal to control the loop of the amplifier system.

* * * * *